United States Patent [19]
Lorenz

[11] Patent Number: 5,315,266
[45] Date of Patent: May 24, 1994

[54] AMPLIFIER HAVING IMPROVED CAPACITIVE DRIVE CAPABILITY

[75] Inventor: Perry S. Lorenz, Sunnyvale, Calif.

[73] Assignee: National Semiconductor Corporation, Santa Clara, Calif.

[21] Appl. No.: 72,363

[22] Filed: Jun. 4, 1993

Related U.S. Application Data

[63] Continuation of Ser. No. 901,521, Jun. 19, 1992, abandoned.

[51] Int. Cl.$^5$ ............................ H03F 1/34; H03F 3/45
[52] U.S. Cl. ................................. 330/294; 330/260; 330/255
[58] Field of Search ............... 330/252, 255, 257, 260, 330/292, 293, 294, 311

[56] References Cited

U.S. PATENT DOCUMENTS 4,417,216 11/1983 Davis ................................. 330/294
4,721,921 1/1988 Vyne et al. ......................... 330/260

Primary Examiner—Steven Mottola
Attorney, Agent, or Firm—Limbach & Limbach

[57] ABSTRACT

An integrated circuit amplifier suitable for use in driving capacitive loads, including a differential amplifier first stage, a third stage and at least one second stage intermediate the first and second stages. A dominant pole capacitor provides a direct negative feedback path between the amplifier output and the output of the first stage so as to tend to oppose any signals present at the output thereby reducing the open loop output impedance of the amplifier. In a preferred embodiment, an isolation resistor is coupled between the first output and a further output and a further compensating capacitor is coupled between the first output and an inverting input to the amplifier so as to produce a zero in the frequency response of the amplifier so as to compensate for any pole in the frequency response of the amplifier caused by any capacitive load connected to the further output.

3 Claims, 3 Drawing Sheets

AMPLIFIER HAVING IMPROVED CAPACITIVE DRIVE CAPABILITY

This is a continuation of co-pending application Ser. No. 07/901,521 filed on Jun. 19, 1992.

BACKGROUND OF THE INVENTION

1. Field of the Invention

The present invention relates generally to amplifier circuitry and in particular to an amplifier circuit suitable for implementation in integrated circuit form and having the capability to drive relatively large capacitive loads while maintaining low power consumption.

2. Background Art

Referring to the drawings, FIG. 1 depicts a simplified schematic diagram of a conventional integrated circuit operational amplifier, generally designated by the numeral 10. The amplifier includes a first or input stage 10A, a second or intermediate stage 10B and a third or output stage 10C.

The first stage 10A includes a differentially-connected pair of PNP transistors Q1 and Q2 connected to a common current source I1. The collectors of transistors Q1 and Q2 are connected to an active load comprising NPN transistors Q3 and Q4. Transistors Q3 and Q4 function as a current mirror and provide a single-ended current output at the collector junction of transistors Q4 and Q2.

The current output of the first stage is coupled to the input of the second stage 10B which includes an NPN transistor Q5 connected in a common emitter configuration. A frequency compensation capacitor Cc is connected between the base and collector of transistor Q5 to form the well known Miller integrator circuit. Capacitor Cc functions to provide a dominant pole in the frequency response of the amplifier. A current source 12 in combination with a pair of series connected diodes D1 and D2 form the load for the second stage. The second stage includes a pair of outputs, one at the anode of diode D1 and the other at the cathode of diode D2. Accordingly, the two outputs of the second stage will be that same except they will be offset from one another by two diode drops.

The outputs of the second stage 10B are coupled to the inputs of the third stage 10C. The third stage includes an NPN transistor Q6 and an PNP transistor Q7, both of which are configured as emitter followers. The voltage drops across diodes D1 and D2 are preferably matched to the base-emitter voltages of transistors Q6 and Q7 so that the current flow through the two diodes matches the current flow through the two transistors. In that case, the idle current in the third stage will be controlled by the magnitude of the current source 12 in the second stage.

In many applications, it is necessary for an amplifier to drive relatively large capacitive loads. Output transistor Q6 functions to source current to the capacitive load so that the load becomes charged and transistor Q7 functions to sink current from the load so that the load becomes discharged.

The open loop output impedance of amplifier 10 can be determined by injecting a current signal at the output and measuring the resultant change in output voltage. The lower the change in output voltage, the lower the open loop output impedance. As is well known, the open loop output impedance of the amplifier together with the load capacitance act as a low-pass filter. The "filter" typically introduces a phase lag at the unity gain frequency $f_u$ of the amplifier, i.e. the frequency at which the open loop gain of the amplifier is unity. The phase lag reduces the phase margin of the amplifier causing the transient response to be degraded. Of course, if the phase margin is reduced to zero, the amplifier will become unstable and will oscillate. Stated somewhat differently, the low-pass filter introduces an undesirable secondary pole in addition to the dominant pole produced by capacitor Cc.

One conventional solution to the above-described problem of driving large capacitive loads is to isolate the capacitive load. FIG. 2 shows the amplifier 10 connected to a capacitive load represented by capacitor C1 connected in parallel with resistor RL. A small value resistor R1 is inserted between the output of the amplifier and the load so as to isolate the output from the capacitive load. In addition, a small value capacitor C2 is connected directly from the output of the amplifier 10 to the inverting input of the amplifier. Capacitor C2 and resistor R1 form a frequency compensation circuit.

The main feedback of the FIG. 2 circuit is provided by resistors R2 and R3. Accordingly, small value resistor R1 is contained within the feedback loop and does not substantially reduce the closed loop output impedance of the circuit. At D.C. and low frequencies, the effect of resistor R1 and capacitor C2 can be ignored. However, at higher frequencies, capacitor C2 functions to directly connect the output of amplifier 10 to the inverting input of the amplifier. This effectively prevents the appearance of the phase-lagging signal resulting from the capacitive load at the inverting input at higher frequencies. Stated somewhat differently, capacitor C2 in combination with resistor R1 introduce a zero which functions to cancel out the undesirable secondary pole created by the finite open loop output impedance and the capacitive load. The higher the output impedance, the lower the frequency of the secondary pole and, therefore, the more difficult it is to compensate the pole.

The actual values for resistor R1 and capacitor C2 are usually determined experimentally. Assuming that amplifier 10 is the LF356 integrated circuit amplifier of National Semiconductor, the load capacitance C1 is 0.5 micro Farads and the load resistance is 2 k ohm. The typical value for the isolation resistor is 10 ohms 20 pico Farads for capacitor C2.

The FIG. 2 circuit is typically implemented with amplifier 10 in integrated circuit form and with the remaining components being discrete. The value of the isolation resistor R1 is a function of the open loop output impedance of amplifier 10. The larger the open loop output impedance, the larger the isolation resistor R1. This reduces the frequency of the secondary pole produced by the load capacitor C1 thereby necessitating the use of a larger value of feedback capacitor C2. For example, assuming that the open loop output impedance of amplifier 10 is 10 ohms, the 10 ohm resistor R1 reduces the magnitude of the signal fed back by capacitor C2 by one half. This may provide sufficient phase margin when the amplifier is configured for a closed loop gain of two but may be insufficient for unity gain configurations.

In many applications, it is desirable to implement as much of a particular circuit in integrated circuit form and to minimize the number of components that are in discrete form. However, it is sometimes difficult or impractical to implement certain components in integrated circuit form. For example, it is difficult to build high quality integrated circuit capacitors which do not require a large amount chip area.

Referring back to the amplifier of FIG. 1, capacitor Cc is typically relatively small and can be (and often is) implemented in integrated circuit form. However, capacitor C2 of FIG. 2 is more difficult to implement in integrated circuit form since it is usually much larger in magnitude than Cc.

One solution to the foregoing is to implement everything except capacitor C2 in integrated circuit form. In that event, the integrated circuit package must include two additional pins to accommodate the external discrete capacitor. This is undesirable in many instances, particularly if more than one circuit is to be integrated and placed in a single package. For example, if four amplifier circuits similar to that of FIG. 2 are to be integrated in common and placed in one package (a quad amplifier product), eight additional pins must be added.

A further solution is to lower the open loop output impedance of the amplifier 10. This permits the use of a smaller resistor R1 and capacitor C2. One conventional approach to lowering the output impedance is to increase the quiescent current flow in the third stage 10C (FIG. 1). This can be done in the case of amplifier 10 by designing current source I2 to provide more current. For example, a 10 ohm output impedance requires a bias current in the output stage of somewhat less than 3 mAmps. This results in increased power consumption and attendant heating of the circuit. This also results in lower battery life in the case of battery powered applications. More importantly, the increased heating limits the number of components which may be placed in the integrated circuit since a large number of heat producing components may cause the maximum operating temperature to be exceeded.

The present invention overcomes the above-noted shortcomings of conventional amplifier circuits having improved capacitive drive capability. The output impedance of the basic amplifier is reduced with decreased power consumption. This permits the use of small integrated circuit capacitors (C2) so that external discrete capacitors need not be used. These and other advantages of the present invention will become apparent to those skilled in the art upon a reading of the following Detailed Description of the Invention together with the drawings.

SUMMARY OF THE INVENTION

An integrated circuit amplifier is disclosed which is suitable for driving capacitive loads. The amplifier includes a differential first stage having first and second inputs and output, and a third stage having an input and a first output.

The amplifier further includes a second amplifier stage coupling the output of the first stage to the input of the third stage, with the third stage and the second stage being implemented such that there is a negative voltage gain greater than unity between the output of the first stage and the first output.

A dominant pole capacitor is included to provide a dominant pole in the frequency response of the amplifier, the capacitor having one terminal connected to the output of the first stage and the other terminal connected to the first output of the amplifier. Accordingly, the capacitor provides a direct negative feedback path to the second stage input which tends to oppose any signal which is injected at the first output of the amplifier thereby reducing the open loop output impedance of the amplifier. The amplifier first stage, the third stage, the second stage and the capacitor are implemented in a common monolithic integrated circuit.

In a further embodiment, an isolation resistor is provided which is connected between the first output and a second output. In addition, a second capacitor is coupled between the first output and the inverting input. A feedback resistor is also coupled between the second output and the inverting input to provide the main overall negative feedback. The second capacitor functions to provide a zero in the frequency response of the amplifier so as to compensate for a secondary pole in the frequency response created by any capacitive load coupled to the second output.

DETAILED DESCRIPTION OF THE INVENTION

Figure 1:
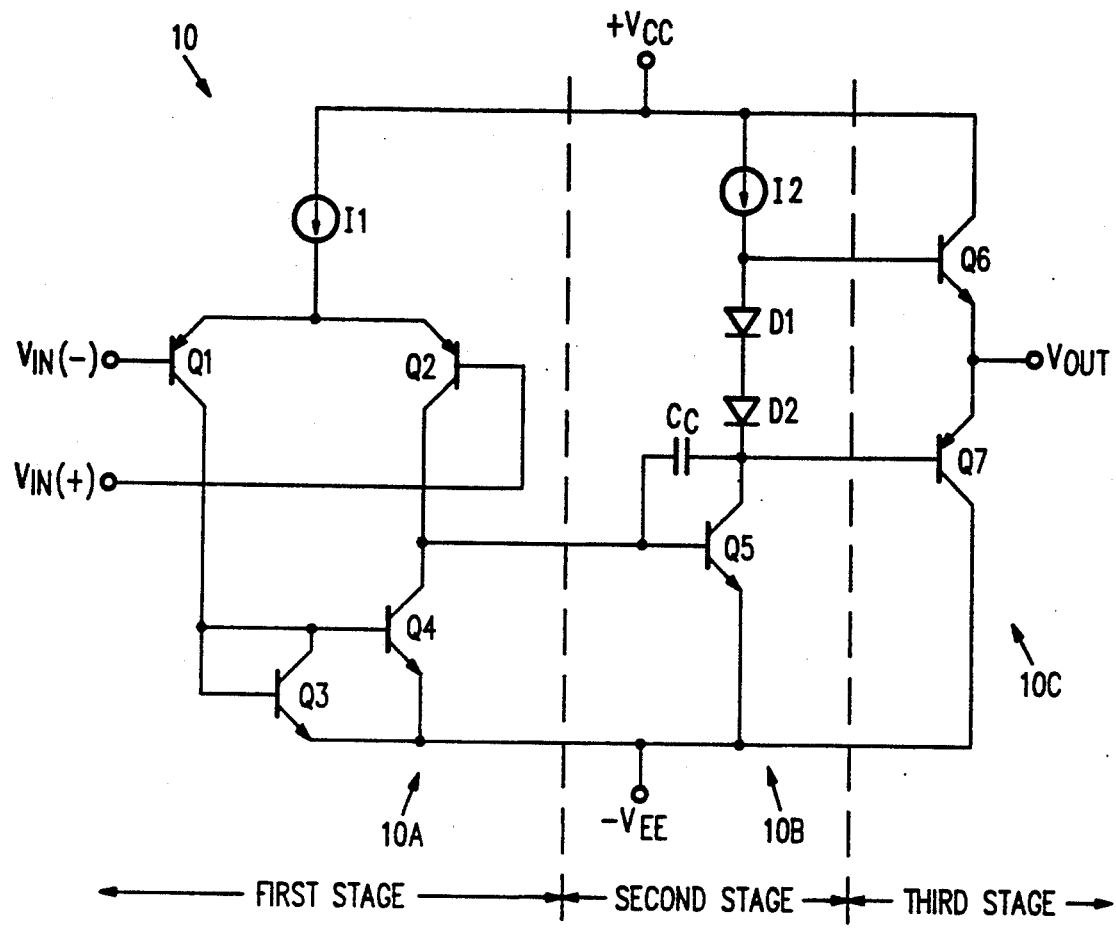
FIG. 1 is a simplified schematic drawing of conventional integrated circuit amplifier showing conventional frequency compensation.
Figure 3:
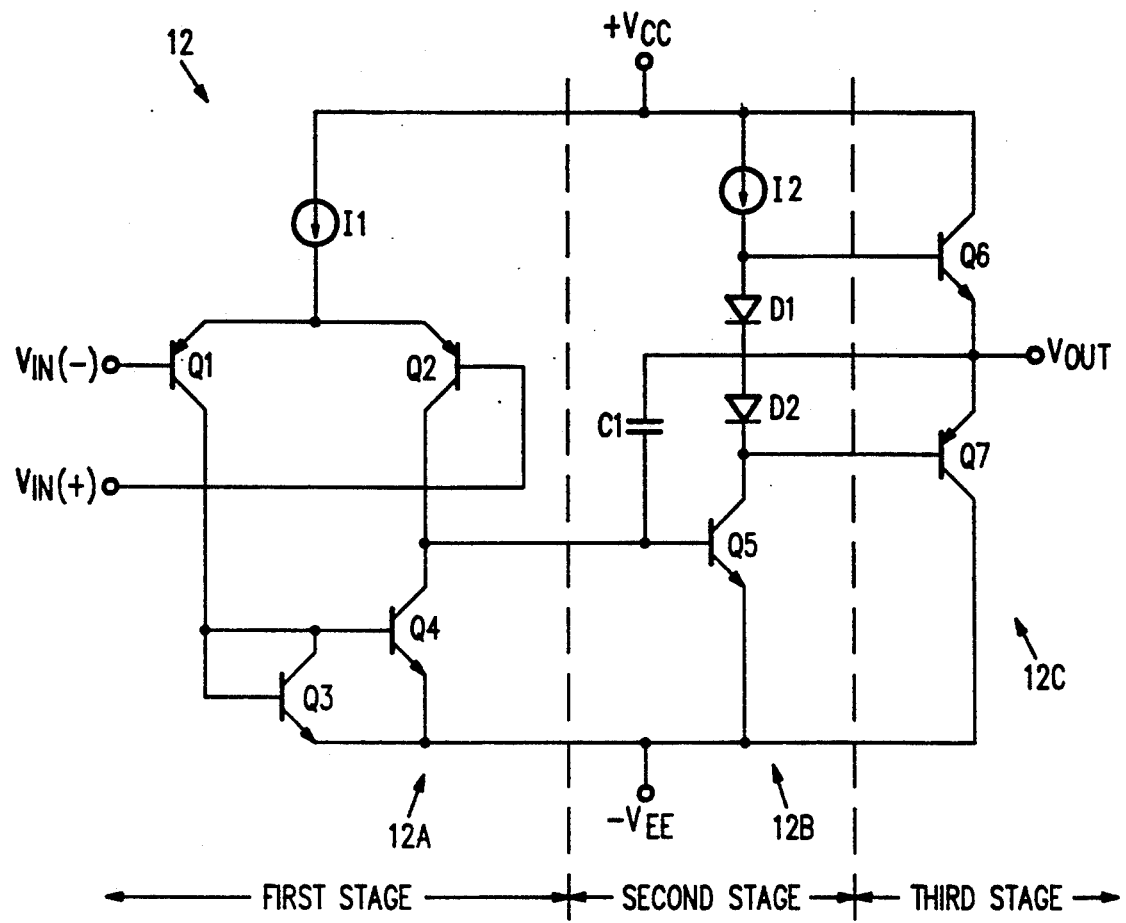
FIG. 3 is a simplified amplifier circuit in accordance with the present invention having a reduced open loop output impedance.

Referring again to the drawings, FIG. 3 depicts an amplifier circuit 12 having reduced open loop output impedance. Like numerals are used to designate like components of the FIG. 1 and 3 circuits. The FIG. 3 circuit is similar to the conventional circuit of FIG. 1 with the exception of the manner in which the circuit is frequency compensated. The FIG. 3 circuit includes a capacitor C1 having one terminal connected to the output of the first stage 12A and the remaining terminal connected to the output of the third stage 12C.

In operation, any small A.C. signal injected at the output of the amplifier 12 is fed directly back to the input of the second stage 12B. Since the second stage both inverts the signal and provides substantial voltage gain, and since the output stage is non-inverting, the fed back signal tends to oppose the signal present at the output. The net result is that the open loop output impedance is reduced. By way of example, in the amplifier circuit of FIG. 5 (to be described later), the open loop output impedance is 140 ohms at D.C. However, at the approximate unity gain frequency $f_u$ of 2 MHz, the impedance drops to only 1.6 ohms. The impedance then begins to increase again at about 2 MHz. This is achieved at an third stage bias current of only 120 microAmps.

Figure 2:
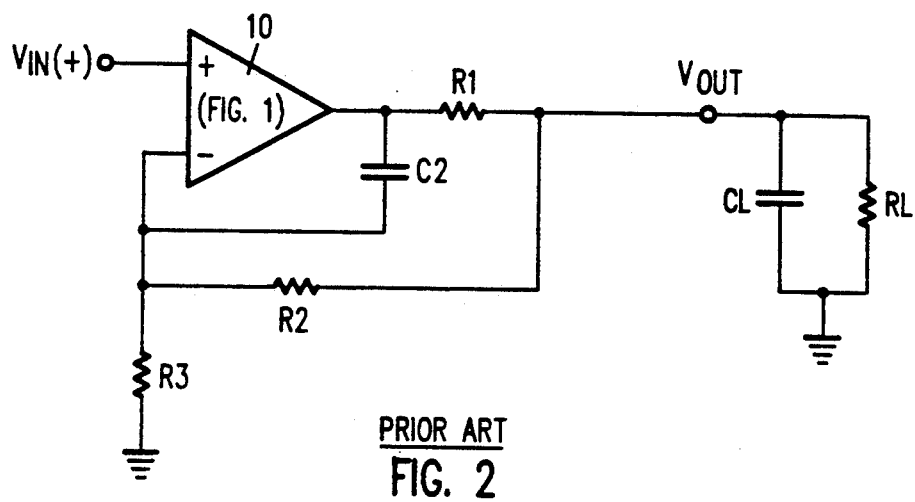
FIG. 2 is a conventional amplifier configuration utilizing the integrated circuit amplifier of FIG. 1 together with discrete external components which enable to amplifier configuration to drive relatively large capacitive loads.
Figure 4:
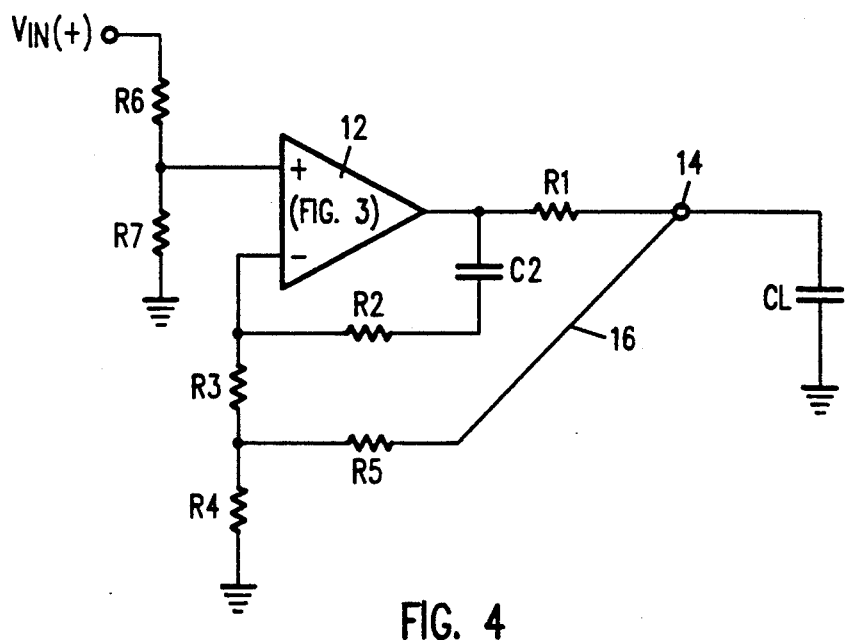
FIG. 4 is an integrated circuit amplifier configuration in accordance with the present invention utilizing the amplifier circuit of FIG. 3.

Referring to FIG. 4, an amplifier configuration in accordance with the present invention is shown utilizing the FIG. 3 low open loop output impedance amplifier 12 circuit. The FIG. 4 configuration uses the same basic direct feedback scheme of the conventional FIG. 2 configuration. However, because of the reduced open loop output impedance of the amplifier 12 of the present invention, the capability of the configuration to drive relatively large capacitive loads is improved. Thus, the amplifier configuration can be used reliably, even in unity gain applications. In addition, all components can be easily implemented in integrated circuit form.

Resistors R4 (10 k ohms), R5 (25 k ohms), R6 (10 k ohms) and R7 (25 k ohms) of the FIG. 4 circuit determine the closed loop gain of the amplifier configuration in the example of FIG. 4. Although the FIG. 4 configuration provides a gain of 2.5, other configuration, including those providing unity gain, would work.

The $R_1C_1$ product relating to the undesirable secondary pole created by the load capacitance C1 is as follows:

$$R_1C_1 = (R_O + R_1) C_1 \quad (1)$$

where $R_1C_1$ is the product which determines the location of the undesirable secondary pole;

Ro is the open loop output impedance of amplifier 12 (2 ohms at the crossover frequency);

R1 is the value of the isolation resistor (8 ohms); and

C1 is the magnitude of the load capacitance (0.1 micro Farad).

The $R_2C_2$ product relating the zero for cancelling the undesirable secondary pole is as follows:

$$R_2C_2 = (R2 + R3 + RA) C2 \quad (2)$$

where $R_2C_2$ is the product which determines the location of the zero;

R2 is the value of resistor R2 (124 k ohms);

R3 is the value of resistor R3 (24 k ohms);

RA (7K ohm) is the parallel combination of resistors R4 (10 k ohm) and R5 (25 k ohm); and C2 is the magnitude of capacitor C2 (8 pico Farads). The zero is located at the undesirable secondary pole by setting the value of $R_1C_1$ roughly equal to that of $R_2C_2$ and by setting the attenuation of the compensation circuit (R1, R2, R3 and C2) roughly equal to the attenuation of the feedback signal provided by R4 and R5. These values may need to be adjusted for optimum frequency response.

At high frequencies, the load capacitance C1 acts as a short circuit to ground. However, the signal into the compensation circuit (R1, R2, R3 and C2) is only slightly attenuated since the open loop output impedance is only 1.6 ohms, substantially less than the value of R1 (8 ohms). Accordingly, the short circuit produced by load capacitor C1 does not disturb the stability of the amplifier. Thus, substantial capacitive drive capability is achieved even for unity gain configurations.

Figure 5:
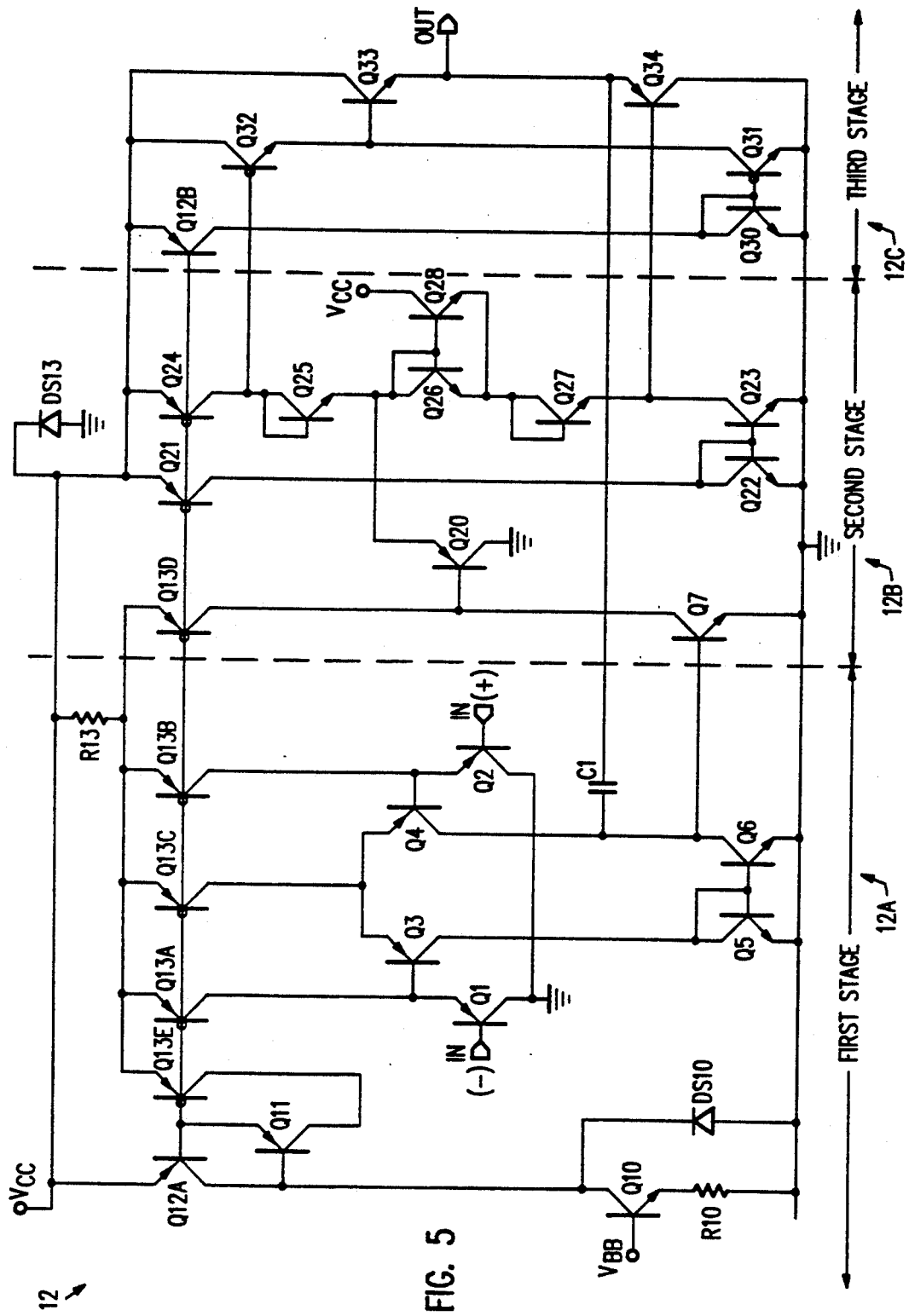
FIG. 5 is a more detailed schematic diagram of an exemplary amplifier circuit in accordance with the present invention having reduced open loop output impedance.

FIG. 5 is a detailed schematic diagram of an exemplary amplifier 12, the simplified diagram of which is shown in FIG. 3. It is important to note that the FIG. 5 amplifier is specially adapted for ground sensing applications where the input and output voltages may be very close to the most negative supply voltage, namely ground. The present invention is in not limited to a particular circuit configuration however.

Many of the details relating to the FIG. 5 amplifier do not directly relate to the subject invention and will not be described so as to avoid obscuring the true nature of the invention in unnecessary detail.

The amplifier 12 includes first stage 12A, second stage 12B and third stage 12C. The first stage includes a differential amplifier stage, the input of which is the bases of transistors Q1 and Q2. The output of the first stage is at the collector of transistor Q4. The base of transistor Q7 comprises the input to the second stage and the collectors of transistors Q23 and Q24 form the two outputs of the second stage. Finally, the common emitter connection of transistors Q33 and Q34 form the output of the third stage and therefore the output of the amplifier.

The frequency compensation capacitor C1 is connected between the output of the input stage (which is the input of the second stage) and the output of the third stage (and the amplifier). Thus, as previously noted, any A.C. signal present at the output of the third stage will be coupled directly back to the second stage input. Since the second stage provides both voltage gain and inverts the signal, negative feedback with gain will result. Accordingly, the fed back signal will tend to cause the output voltage to oppose any signal injected at the output thereby effectively reducing the open loop output impedance of the amplifier.

Thus, a novel amplifier circuit has been disclosed which is suitable for implementation in integrated circuit form and which is capable of driving large capacitive loads while consuming only a small amount of power. While a particular embodiment has been described in some detail, it is to be understood that various changes can be made by those skilled in the art without departing from the spirit and scope of the invention as defined by the appended claims. For example, it would be possible to add further intermediate amplifier stages in addition to the second stage 12B so long as capacitor C1 continues to provide negative feedback with gain.

I claim:

1. An amplifier having a low output impedance comprising:

a differential amplifier first stage having a first inverting input and a second noninverting input and an output;

a third stage having an input and a first output;

a second amplifier stage intermediate the first and third stages and coupling the output of the first stage to the input of the third stage, with the third stage and the second stage being implemented such that there is a negative voltage gain greater than unity between the output of the first stage and the first output;

a dominant pole capacitor which functions to establish a dominant pole in the frequency response to the amplifier, the dominant pole capacitor having one terminal connected to the output of the first stage and a second terminal connected to the first output and with the first stage, the second stage, the third stage and the dominant pole capacitor being implemented in a common monolithic integrated circuit; whereby the dominate pole capacitor provides a direct feedback path between the output of the first stage and the first output so as to reduce the open loop impedance of the amplifier stage at the first output;

a second output;

an isolation resistor coupled between the first and second outputs;

a second capacitor coupled between the first output and the first input; and a feedback resistor coupled between the second output and the first input;

whereby the second capacitor creates a zero in the frequency response of the amplifier to compensate for a pole produced by any capacitive load coupled to the second output.

2. An amplifier having a low output impedance comprising:

- a differential amplifier first stage having first and second inputs and an output, wherein the first and second inputs are inverting and non-inverting first stage amplifier inputs, respectfully;
- a third stage having an input and a first output, said third stage being a unity voltage gain, non-inverting stage;
- a second amplifier stage intermediate the first and third stages and coupling the output of the first stage to the input of the third stage, with the third stage and the second stage being implemented such that there is a negative voltage gain greater than unity between the output of the first stage and the first output; and
- a dominant pole capacitor which functions to establish a dominant pole int he frequency response to the amplifier, the dominant pole capacitor having one terminal connected to the output of the first stage and a second terminal connected to the first output and with the first stage, the second stage, the third stage and the dominant pole capacitor being implemented in a common monolithic integrated circuit;
- a second output;
- an isolation resistor coupled between the first and second outputs;
- a second capacitor coupled between the first output and the first input; and
- a feedback resistor coupled between the second output and the first input;

whereby the dominant pole capacitor provides a direct feedback path between the output of the first stage and the first output so as to reduce the open loop impedance of the amplifier stage at the first output; and whereby the second capacitor creates a zero in the frequency response of the amplifier to compensate for a pole produced by any capacitive load coupled to the second output.

3. The amplifier of claim 2 wherein the isolation resistor, the feedback resistor and the second capacitor are implement in the common monolithic integrated circuit.

* * * * *

UNITED STATES PATENT AND TRADEMARK OFFICE
CERTIFICATE OF CORRECTION

PATENT NO. : 5,315,266
DATED : May 24, 1994
INVENTOR(S) : PERRY S. LORENZ

It is certified that error appears in the above-indentified patent and that said Letters Patent is hereby corrected as shown below:

In Col. 7, line 25, after the word "pole" please correct "int he" to "in the";

In Col. 7, line 25, after the word "response" please correct the word "to" to "of";

In Col. 8, line 26, please correct the word "implement" to "implemented".

Signed and Sealed this

Thirteenth Day of September, 1994

Attest:

BRUCE LEHMAN

*Attesting Officer*    *Commissioner of Patents and Trademarks*